(12) United States Patent
Hanada et al.

(10) Patent No.: US 10,064,297 B2
(45) Date of Patent: Aug. 28, 2018

(54) ELECTRONIC CONTROL UNIT

(71) Applicant: DENSO CORPORATION, Kariya, Aichi-pref. (JP)

(72) Inventors: Tomoki Hanada, Kariya (JP); Ryo Nishimoto, Kariya (JP); Hiroyuki Ibaraki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/090,194

(22) Filed: Apr. 4, 2016

(65) Prior Publication Data
US 2016/0295729 A1 Oct. 6, 2016

(30) Foreign Application Priority Data

Apr. 6, 2015 (JP) .................................. 2015-77732

(51) Int. Cl.
*H05K 5/00* (2006.01)
*H05K 5/03* (2006.01)

(52) U.S. Cl.
CPC ......... *H05K 5/0052* (2013.01); *H05K 5/0047* (2013.01)

(58) Field of Classification Search
CPC .................. H05K 5/0052; H05K 5/0047
See application file for complete search history.

(56) References Cited

U.S. PATENT DOCUMENTS

| | | | | |
|---|---|---|---|---|
| 6,111,760 A * | 8/2000 | Nixon | ................... | H04B 1/3833 |
| | | | | 220/4.02 |
| 6,166,918 A * | 12/2000 | Olofsson | ............... | H05K 9/0032 |
| | | | | 174/361 |
| 6,548,972 B2 * | 4/2003 | Takagi | ................. | B62D 5/0406 |
| | | | | 318/293 |
| 7,643,310 B2 * | 1/2010 | Long | ..................... | H05K 9/0032 |
| | | | | 174/350 |
| 8,665,603 B2 * | 3/2014 | Brieda | ................. | H05K 7/1417 |
| | | | | 361/752 |
| 9,686,877 B2 * | 6/2017 | Tokumasu | ........... | H05K 5/0221 |

(Continued)

FOREIGN PATENT DOCUMENTS

| | | |
|---|---|---|
| JP | H06-021663 | 1/1994 |
| JP | H06-031179 | 4/1994 |

(Continued)

*Primary Examiner* — Nathan Milakovich
(74) *Attorney, Agent, or Firm* — Knobbe, Martens, Olson & Bear, LLP

(57) ABSTRACT

An electronic control unit includes a substrate, a first cover, and a second cover. An electronic component is mounted on the substrate. The first cover is disposed to be opposed to one surface of the substrate and includes a first sidewall part extending in a direction perpendicular to the substrate, and claw part(s) projecting laterally from the first sidewall part. The second cover is disposed to be opposed to the other surface of the substrate and includes a second sidewall part, and groove part(s). The second sidewall part faces the first sidewall part. The groove part(s) is formed at the second sidewall part such that a shape of each of the groove part(s) when viewed from the direction perpendicular to the substrate is a recessed shape in conformity with a projecting shape of a corresponding claw part. Each groove part is fitted to a corresponding claw part.

13 Claims, 8 Drawing Sheets

(56) References Cited

U.S. PATENT DOCUMENTS

| | | | | |
|---|---|---|---|---|
| 2003/0206392 A1* | 11/2003 | Kawata | ................ | H05K 1/0203 |
| | | | | 361/631 |
| 2010/0254093 A1* | 10/2010 | Oota | ................... | B60R 16/0239 |
| | | | | 361/720 |
| 2013/0148317 A1* | 6/2013 | Sano | .................... | H05K 5/0004 |
| | | | | 361/752 |
| 2016/0295745 A1* | 10/2016 | Nishimoto | ......... | H05K 7/20854 |

FOREIGN PATENT DOCUMENTS

| JP | 2013-165107 A | 8/2013 |
|---|---|---|
| JP | 2014-086603 | 5/2014 |

* cited by examiner

ELECTRONIC CONTROL UNIT

CROSS REFERENCE TO RELATED APPLICATION

This application is based on Japanese Patent Application No. 2015-77732 filed on Apr. 6, 2015, the disclosure of which is incorporated herein by reference.

TECHNICAL FIELD

The present disclosure relates to an electronic control unit having a cover disposed on either side of a substrate.

BACKGROUND

There has been known an electronic control unit having covers that are disposed on the two respective sides of a substrate so as to configure a casing accommodating the substrate in order to protect the substrate from dust, water, and the like. For example, JP2013-165107A discloses an electronic control unit, in which covers are disposed on the two sides of a substrate and fixed to each other by snap fitting.

In the electronic control unit of JP2013-165107A, a first cover is disposed on one side of the substrate and has claw parts on its sidewall, and a second cover is disposed on the other side of the substrate and has through-holes on its sidewall. Each claw part of the first cover is fitted in each through-hole of the second cover, thereby the two covers are fixed to each other.

However, casting of the cover having the through-holes as disclosed in JP2013-165107A requires a movable mold that moves in a direction perpendicular to a mold opening direction in addition to a movable mold that moves in the mold opening direction, leading to a complicated structure of the overall mold. Although drilling may be performed after casting without forming the through-holes during the casting, this inevitably requires a step of removing burrs that occur during the drilling, leading to an increased number of steps.

SUMMARY

The present disclosure addresses at least one of the above issues. Thus, it is an objective of the present disclosure to provide an electronic control unit capable of limiting an increase in the number of steps while a mold for producing the cover is simplified.

To achieve the objective of the present disclosure, there is provided an electronic control unit including a substrate, a first cover, and a second cover. An electronic component is mounted on the substrate. The first cover is disposed to be opposed to one surface of the substrate and includes a first sidewall part extending in a direction perpendicular to the substrate, and at least one claw part projecting laterally from the first sidewall part. The second cover is disposed to be opposed to the other surface of the substrate and includes a second sidewall part, and at least one groove part. The second sidewall part faces the first sidewall part. The at least one groove part is formed at the second sidewall part such that a shape of each of the at least one groove part when viewed from the direction perpendicular to the substrate is a recessed shape in conformity with a projecting shape of a corresponding one of the at least one claw part. Each of the at least one groove part is fitted to a corresponding one of the at least one claw part.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

An electronic control unit according to an embodiment is now described with reference to the accompanying drawings. An electronic control unit of an embodiment is applied to, for example, an electromotive power steering system of a vehicle, and can control operation of a motor that generates assist torque assisting the steering by a driver.

Figure 1:
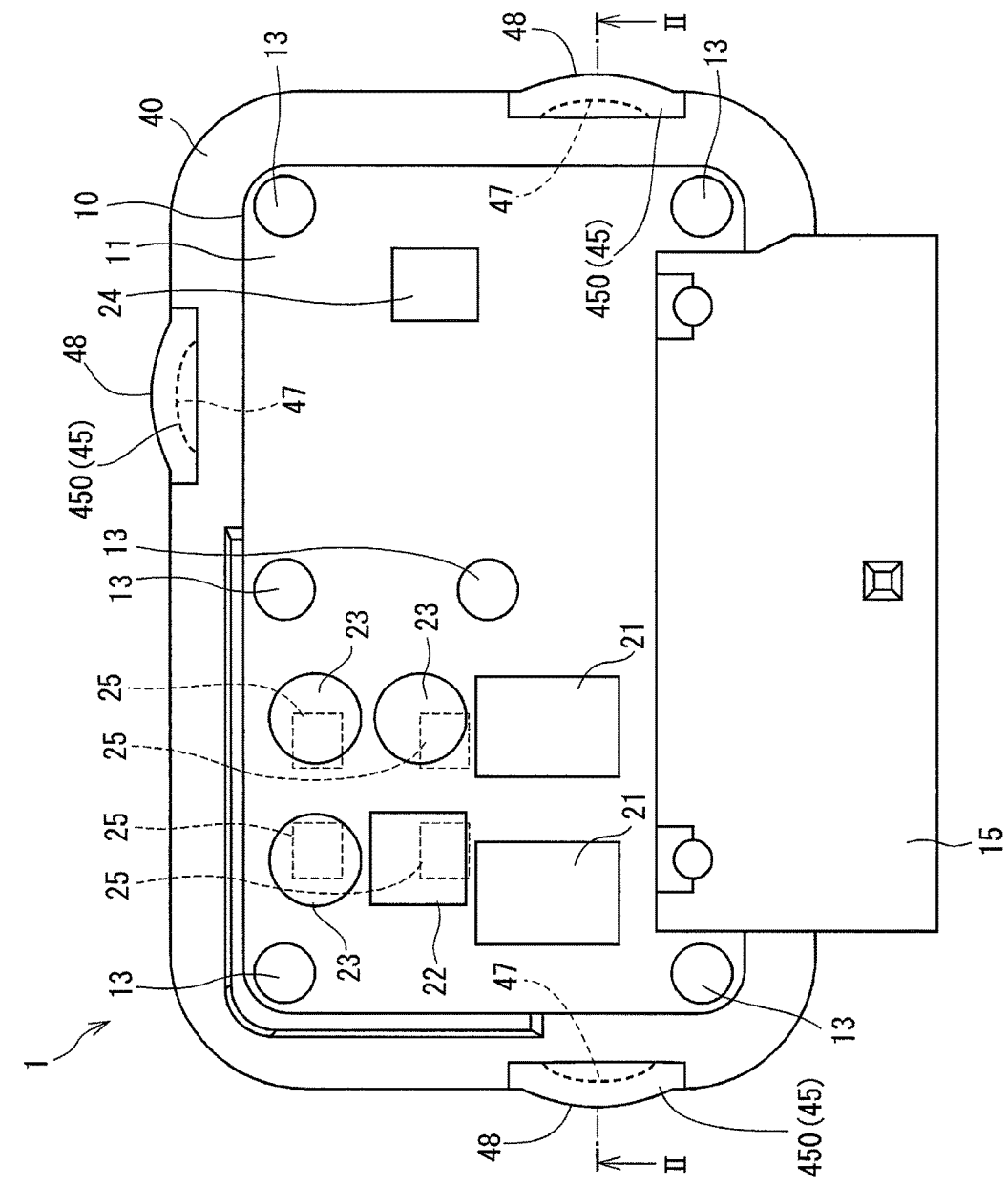
FIG. 1 is a plan view illustrating an electronic control unit according to an embodiment except for a first cover.
Figure 2:
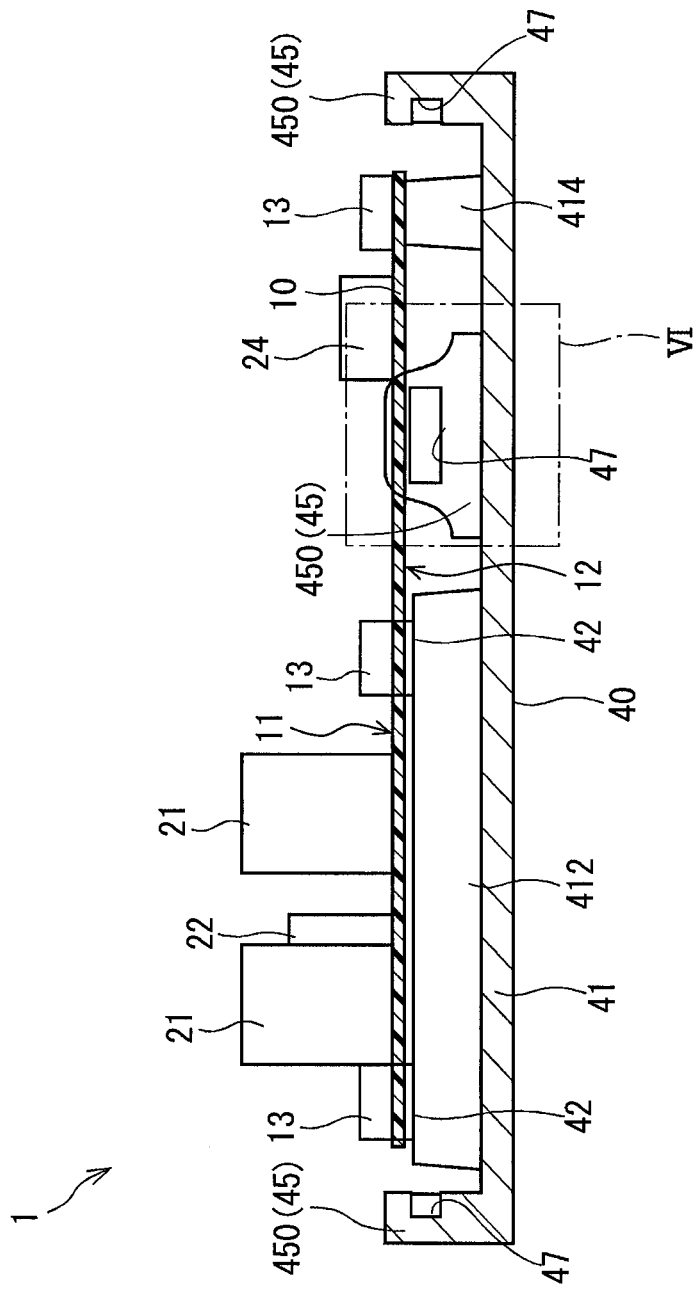
FIG. 2 is a sectional arrow view along a line II-II in FIG. 1.
Figure 3:
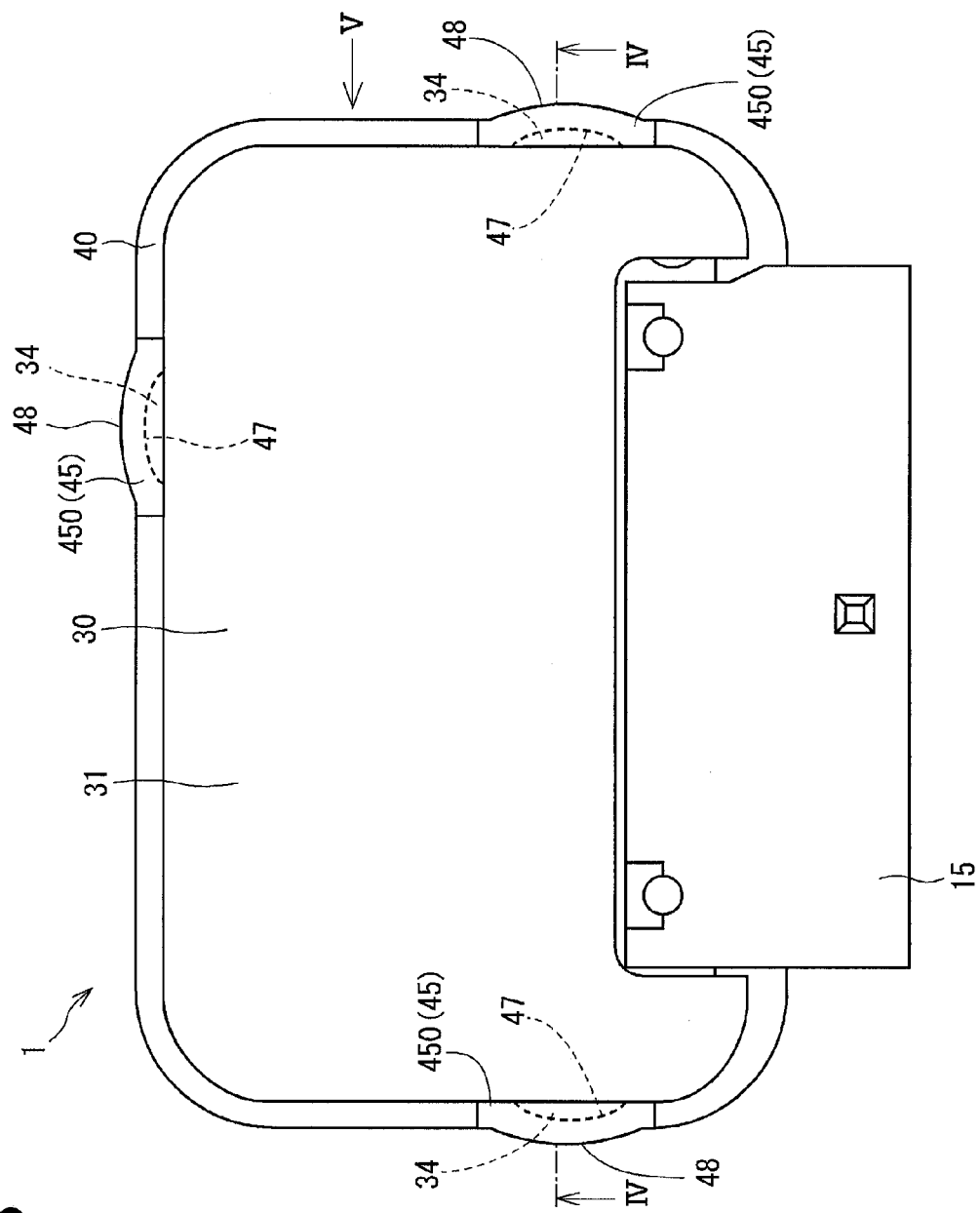
FIG. 3 is a plan view of the electronic control unit of the embodiment.
Figure 4:
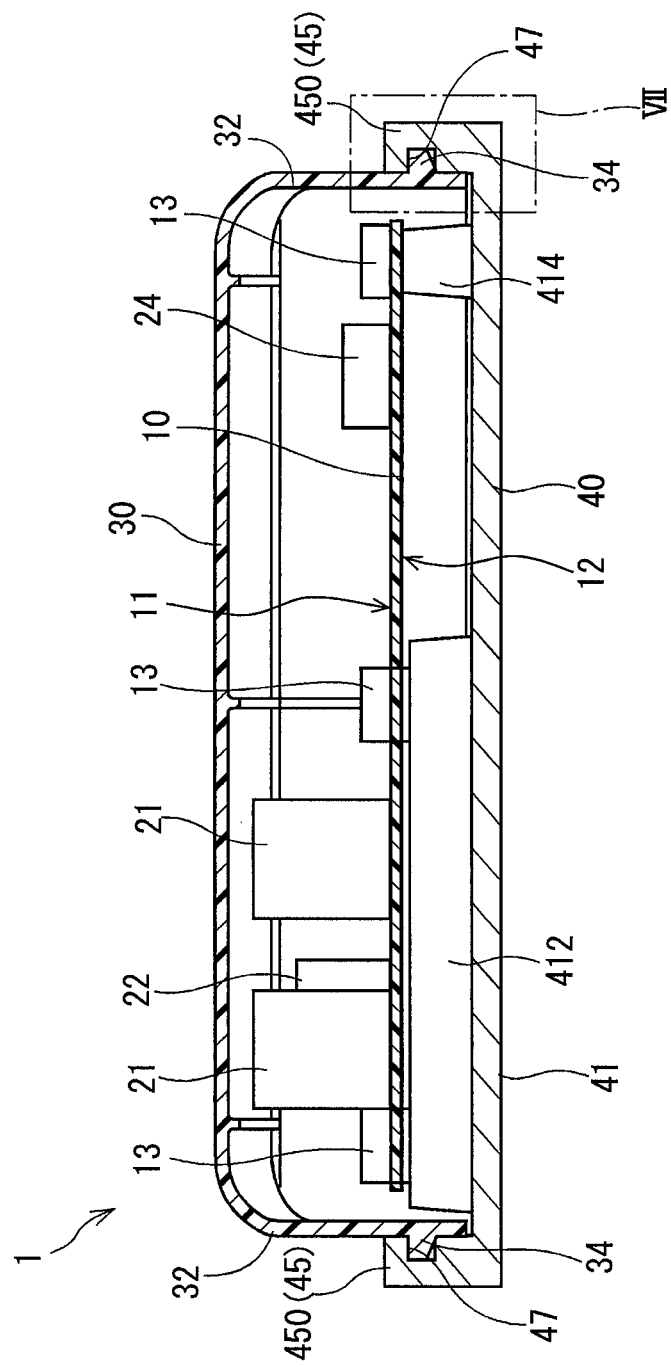
FIG. 4 is a sectional arrow view along a line IV-IV in FIG. 3.
Figure 5:
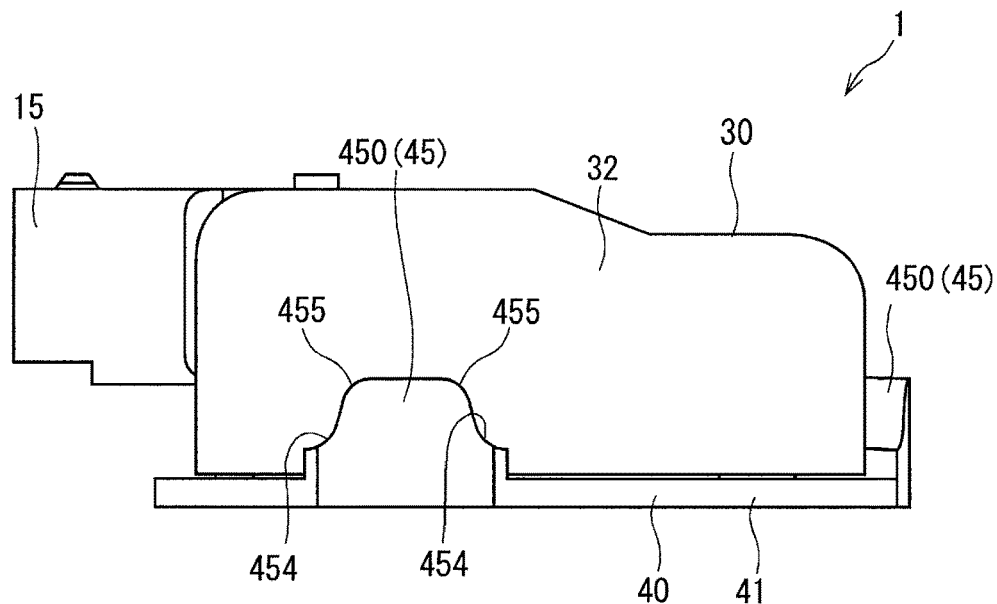
FIG. 5 is a side view of FIG. 3 as viewed from an arrow V direction.
Figure 6:
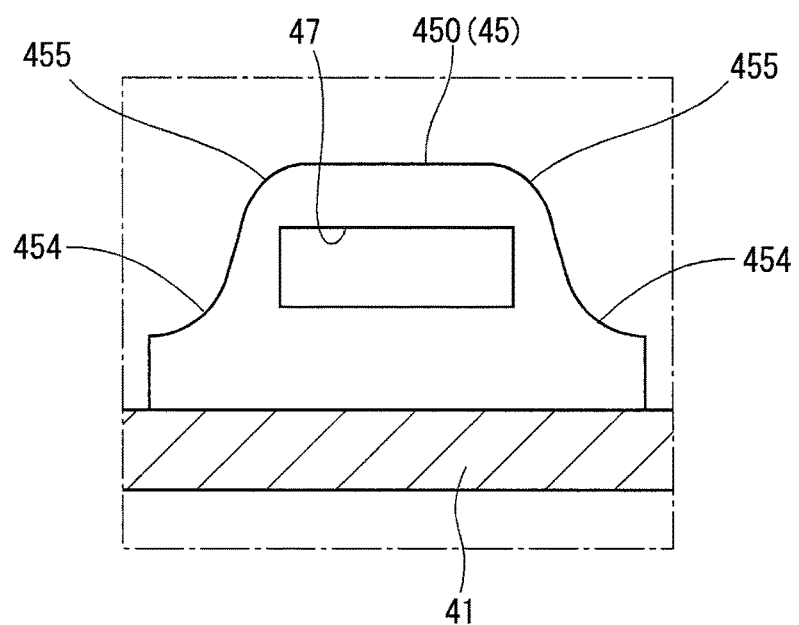
FIG. 6 is a partial enlarged view of a portion VI in FIG. 2.

A configuration of an electronic control unit 1 is now described with reference to FIGS. 1 to 6. The electronic control unit 1 includes a substrate 10, a first cover 30, a second cover 40, and the like. FIGS. 1 and 2 each omit the first cover 30. FIG. 6 omits the substrate 10.

The substrate 10 is a printed circuit board formed into a substantially rectangular shape with an insulating material. Hereinafter, one surface of the substrate 10 is referred to as first surface 11, and the other surface is referred to as second surface 12. Various electronic components are mounted on the substrate 10. For example, relays 21, a coil 22, capacitors 23, a microcomputer 24, and the like are mounted on the first surface 11 of the substrate 10, and switching elements 25 and the like are mounted on the second surface 12 of the substrate 10. The substrate 10 is provided with a connector 15 to be connected to a harness or the like for the electronic control unit 1 to externally receive/send power or a control signal.

The first cover 30 is disposed so as to be opposed to the first surface 11 of the substrate 10, and has a first bottom part 31 covering the first surface 11 of the substrate 10, and a first sidewall part 32 extending from the first bottom part 31 in a direction perpendicular to the substrate 10. In the present embodiment, the first cover 30 is formed of resin, for example.

The second cover 40 is disposed so as to be opposed to the second surface 12 of the substrate 10, and has a second bottom part 41 covering the second surface 12 of the substrate 10, and a second sidewall part 45 extending from the second bottom part 41 in the direction perpendicular to the substrate 10.

In the present embodiment, the second sidewall part 45 is configured of one or more (three in the present embodiment) convex parts 450 projecting toward the substrate 10. The convex parts 450 are disposed near an outer edge of the second bottom part 41 with some intervals. Each convex part 450 faces the first sidewall part 32 from the outside of the first cover 30, and is fixed to the first sidewall part 32 by snap fitting.

The convex part 450 projects from the second bottom part 41 toward the substrate 10 in a curved-line profile. Specifically, the convex part 450 becomes narrower in width toward the substrate 10, and has curved connection regions 454 between the different width portions. Edge parts 455 at a tip of the convex part 450 are each rounded (see FIGS. 5 and 6).

In the present embodiment, the second cover 40 is formed of a metal material having high heat conductance such as aluminum so as to serve as a heat sink. The second cover 40 has a radiating part 412 and a support part 414 each projecting toward the substrate 10. The radiating part 412 is in contact with the switching elements 25 mounted on the second surface 12 of the substrate 10 with, for example, a radiating gel in between, and thus radiates heat generated by the switching elements 25. The substrate 10 is fixed to the support part 414 by fixation components 13 such as small screws.

In such a configuration, the first cover 30 and the second cover 40 are disposed so as to sandwich the substrate 10 from both sides, and configure a casing accommodating the substrate 10. Consequently, the electronic components 21 to 25 mounted on the first surface 11 and the second surface 12 of the substrate 10 are protected from external shock, water, dust, and the like.

Figure 7:
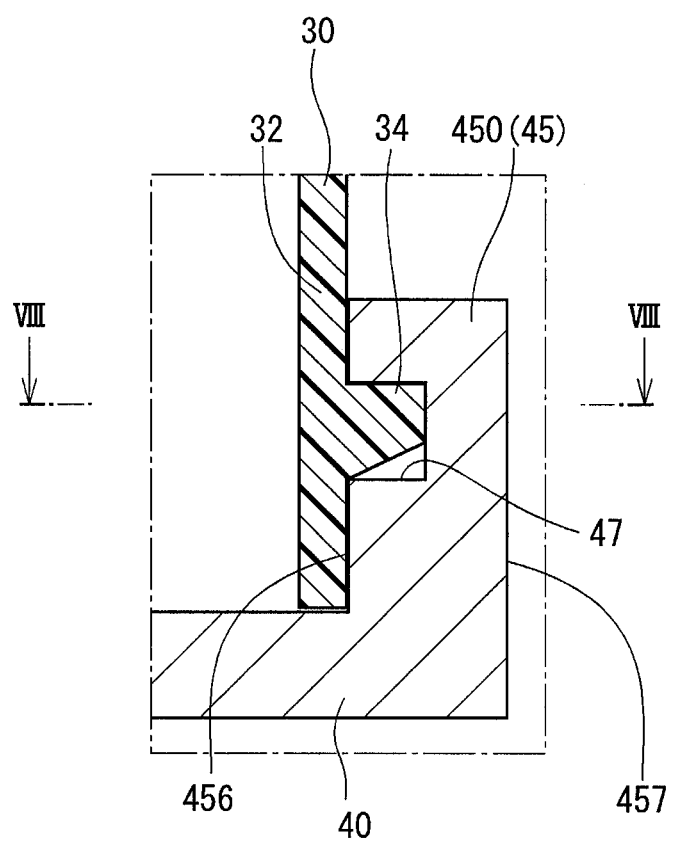
FIG. 7 is a partial enlarged view of a portion VII in FIG. 4.
Figure 8:
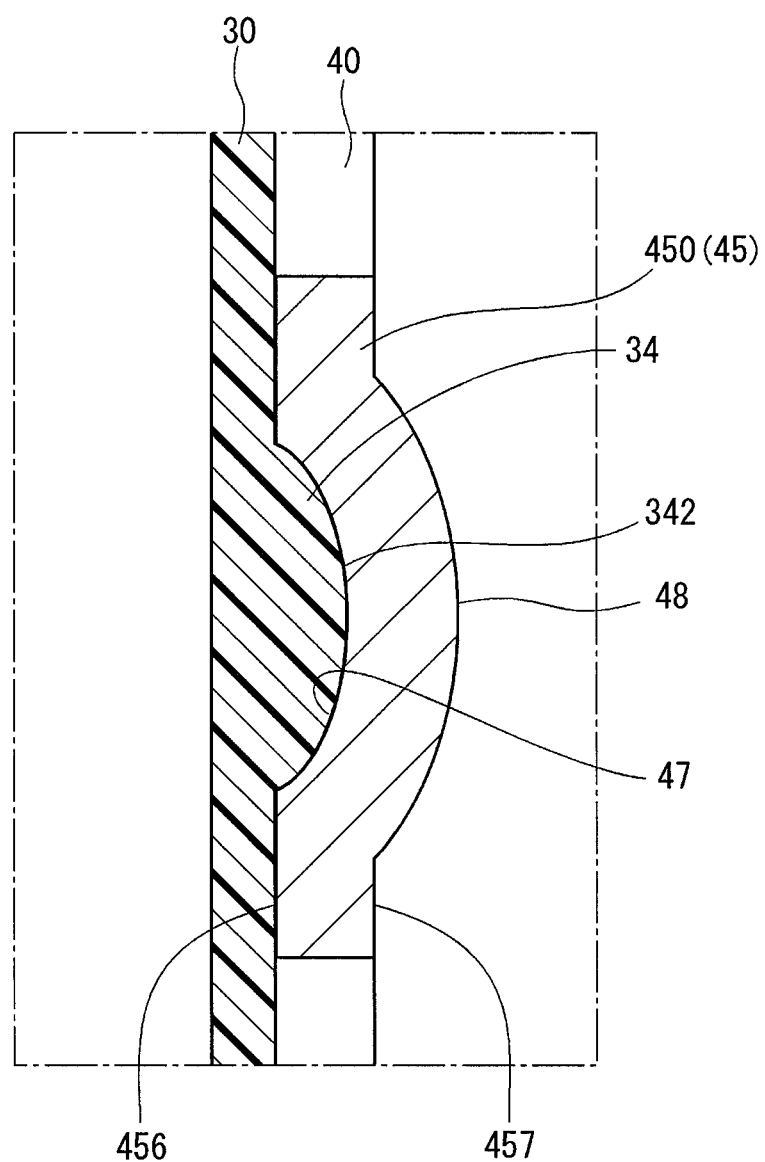
FIG. 8 is a sectional arrow view along a line VIII-VIII in FIG. 7.

A structure for fixing the first cover 30 to the second cover 40 is now described with reference to FIGS. 7 and 8. The first cover 30 has one or more (three in the present embodiment) claw parts 34 projecting outward from the first sidewall part 32. Each claw part 34 is provided at a position corresponding to the convex part 450 of the second cover 40. An end surface 342 of the claw part 34 has an arcuate profile as viewed from the direction perpendicular to the substrate 10.

The second cover 40 has groove parts 47 provided on wall surfaces 456, each wall surface facing the inside of the second cover 40, of the convex parts 450. An inner wall surface of each groove part 47 has an arcuate profile as viewed from the direction perpendicular to the substrate 10. Specifically, the convex shape of the claw part 34 corresponds to the concave shape of the groove part 47 as viewed from the direction perpendicular to the substrate 10. The convex part 450 has a wall surface 457 on a side opposite to each wall surface 456 having the groove part 47, and has a swelling part 48 on the wall surface 457, the swelling part 48 having a convex shape corresponding to the concave shape of the groove part 47.

When the first cover 30 is attached to the second cover 40, the first cover 30 is pressed to the second cover 40 having the substrate 10 fixed thereto in the direction perpendicular to the substrate 10. During this operation, each claw part 34 of the first cover 30 moves while being in contact with the convex part 450 of the second cover 40, thereby the first sidewall part 32 resiliently deforms toward the inside of the first cover 30. The claw part 34 is then fitted into the groove part 47, thereby the first sidewall part 32 returns to the original shape. While force is applied to the convex part 450 from the first cover 30, the convex part 450 is not deformed by the force. When the first cover 30 has been attached, the first sidewall part 32 is in contact with the wall surface 456 of each convex part 450. In this way, the first cover 30 is attached to the second cover 40.

Effects of the electronic control unit 1 of the present embodiment will be described below. (1) As described above, the electronic control unit 1 of the present embodiment includes the substrate 10 on which the electronic components 21 to 25 are mounted, the first cover 30 disposed on a first surface 11 side of the substrate 10, and the second cover 40 disposed on a second surface 12 side of the substrate 10. The first cover 30 includes the first sidewall part 32 extending in the direction perpendicular to the substrate 10, and one or more claw parts 34 projecting from the first sidewall part 32. The second cover 40 includes the second sidewall part 45 facing the first sidewall part 32, and one or more groove parts 47 that are each provided on the second sidewall part 45 so as to have the concave shape corresponding to the convex shape of the claw part 34 as viewed from the direction perpendicular to the substrate 10, and that are each to be fitted with the claw part 34.

For production of the electronic control unit 1 having such a configuration, the first cover 30 is fixed to the second cover 40 while the substrate 10 is disposed between the first cover 30 and the second cover 40. At this time, the claw part 34 of the first cover 30 is fitted in the groove part 47 of the second cover 40. Specifically, the first cover 30 is attached to the second cover 40 by so-called snap fitting.

The second cover 40 has the groove parts 47 in place of "through-holes" used in existing techniques. This makes it possible to limit an increase in the number of steps while a mold for producing the second cover 40 is simplified.

For example, for production of the second cover 40, a second cover 40 having no groove part 47 is first casted. Such casting simply requires a mold that is a movable mold moving in a mold opening direction while simply requiring a movable mold moving in a direction perpendicular to the mold opening direction. Consequently, the mold is simplified. Subsequently, the produced molding is subjected to machining such as cutting to form the groove parts 47. Such machining does not cause burrs that typically occur in through-hole formation, thus eliminating the need of the burring step or the like. Consequently, an increase in the number of steps is limited.

According to the above-described configuration, the convex shape of the claw part 34 of the first cover 30 corresponds to the concave shape of the groove part 47 of the second cover 40 as viewed from the direction perpendicular to the substrate 10. This provides sufficient contact area between the claw part 34 and the groove part 47, and suppresses backlash of each fitted portion; hence, wear or chipping of the claw part 34 can be avoided. Consequently, although the second cover 40 has the groove parts 47 in place of "through-holes", sufficient attachment strength of the first cover 30 to the second cover 40 is provided.

(2) In the present embodiment, the first cover 30 is a resilient body, while the second cover 40 is a non-resilient body. According to such a configuration, the first cover 30 is preferably attached to the second cover 40 by snap fitting. In this specification, "the first cover 30 is a resilient body" means that the first cover 30 roughly has a resilient modulus large enough to be resiliently deformed by the stress applied during the attachment. "The second cover 40 is a non-resilient body" means that the second cover 40 roughly has a resilient modulus small enough not to be deformed by the stress applied during the attachment.

(3) In the present embodiment, the end surface 342 of the claw part 34 has an arcuate profile as viewed from the direction perpendicular to the substrate 10. According to such a configuration, the claw part 34 is thicker on its root side than on its tip side; hence, the claw part 34 has a structure resistant to shock. The groove part 47 having the concave shape corresponding to the convex shape of the claw part 34 can be easily formed using a rotating tool.

(4) In the present embodiment, the second sidewall part 45 has the wall surface 457 on the side opposite to each wall surface 456 having the groove part 47, and has the swelling part 48 on the wall surface 457, the swelling part 48 having the convex shape corresponding to the concave shape of the groove part 47. Such a configuration compensates the thickness of the second sidewall part 45 in the portion having the groove part 47, resulting in sufficient strength of the portion.

(5) In the present embodiment, the second sidewall part 45 is configured of one or more convex parts 450 each projecting toward the substrate 10 in a curved-line profile, and the groove part 47 is provided for each of the convex parts 450. According to such a configuration, the second sidewall part 45 is configured of one or more convex parts 450 and thus does not have a continuous wall surface, allowing weight reduction of the second cover 40. The convex part 450 has the curved-line profile, which improves run of molten metal along the convex part 450 during the casting of the second cover 40.

Figure 9:
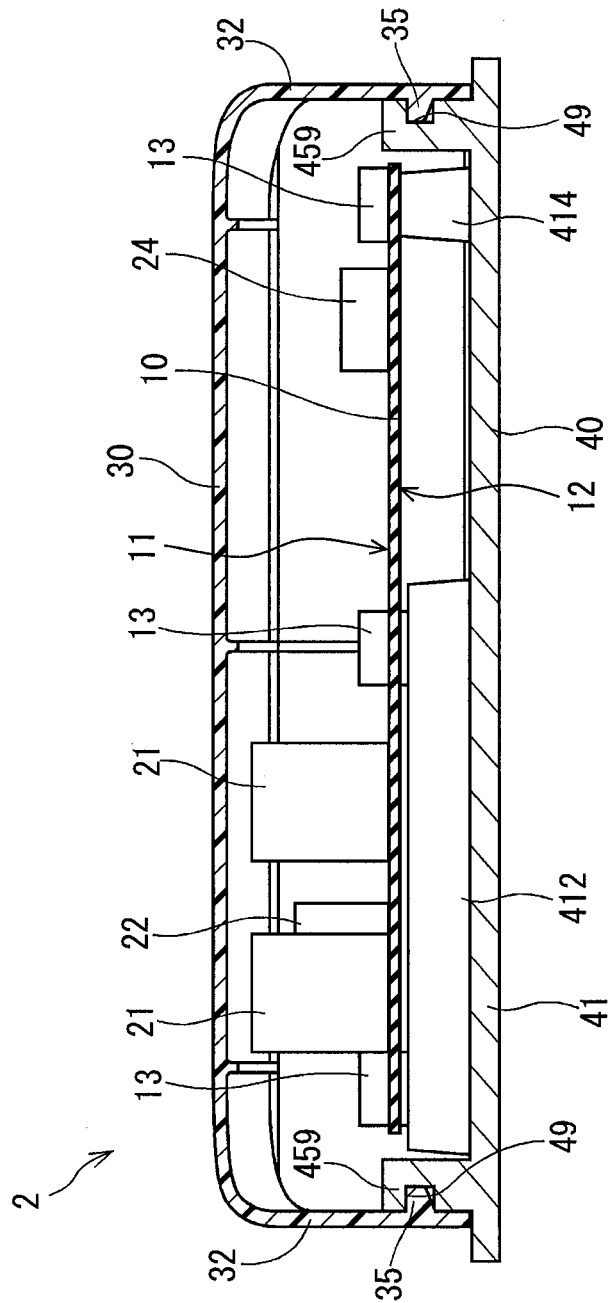
FIG. 9 is a sectional view of an electronic control unit according to a modification.

Modifications to the above embodiment will be described below. An electronic control unit 2 in a modification may be configured as illustrated in FIG. 9. In the configuration as illustrated in FIG. 9, each convex part 459 of the second cover 40 is disposed on a slightly inner side than the outer edge of the second bottom part 41, and faces the first sidewall part 32 from the inside of the first cover 30. A groove part 49 is provided on a wall surface of the convex part 459 facing the outside of the second cover 40. A claw part 35 projects toward the inside of the first cover 30 from the first sidewall part 32. Specifically, in the embodiment as shown in FIG. 9, the groove part 49 and the claw part 35 are each provided in an inward or outward direction opposite to that in the above embodiment. Such a configuration also exhibits the effects similar to those in the above embodiment.

Although the first cover 30 is a resilient body, while the second cover 40 is a non-resilient body in the above embodiment, this relation may be reversed. For example, it is also possible that the first cover 30 is formed of a metal material, and the second cover 40 is formed of resin or the like. In such a case, the second cover 40 can be produced by injection formation, for example. In addition, as with the above embodiment, it is possible to limit an increase in the number of steps while a mold for injection formation of the second cover 40 is simplified.

In the above embodiment, the claw parts 34 and 35 of the first cover 30, and the groove parts 47 and 49 and the swelling parts 48 of the second cover 40 each have an arcuate profile as viewed in the direction perpendicular to the substrate 10. This however is not limitative, and each of the parts may have various profiles.

In the above embodiment, the second sidewall part 45 is configured of the separate convex parts 450. This however is not limitative. For example, the second sidewall part 45 may be integrally configured so as to surround the substrate 10.

The electronic control unit of the disclosure is not limitedly used as a unit that controls the steering assist motor of the electromotive power steering system, and may be used as a unit for any other service. The disclosure is not limited to the above-described embodiments, and can be carried out in various modes within the scope without departing from the gist of the disclosure.

To sum up, the electronic control unit 1, 2 of the above embodiment may be described as follows.

An electronic control unit 1, 2 includes a substrate 10, a first cover 30, and a second cover 40. An electronic component 21-25 is mounted on the substrate 10. The first cover 30 is disposed on one surface 11-side of the substrate 10 and includes a first sidewall part 32 extending in a direction perpendicular to the substrate 10, and at least one claw part 34, 35 projecting laterally from the first sidewall part 32. The second cover 40 is disposed on the other surface 12-side of the substrate 10 and includes a second sidewall part 45, and at least one groove part 47, 49. The second sidewall part 45 faces the first sidewall part 32. The at least one groove part 47, 49 is formed at the second sidewall part 45 such that a shape of each of the at least one groove part 47, 49 when viewed from the direction perpendicular to the substrate 10 is a recessed shape in conformity with a projecting shape of a corresponding one of the at least one claw part 34, 35. Each of the at least one groove part 47, 49 is fitted to a corresponding one of the at least one claw part 34, 35.

For production of the electronic control unit 1, 2 having such a configuration, the first cover 30 is fixed to the second cover 40 while the substrate 10 is disposed between the first and second covers 30, 40. At this time, the claw part 34, 35 of the first cover 30 is fitted in the groove part 47, 49 of the second cover 40. Specifically, the first cover 30 is attached to the second cover 40 by so-called snap fitting.

The second cover 40 has the groove parts 47, 49 in place of "through-holes" used in existing techniques. This makes it possible to limit an increase in the number of steps while a mold for producing the second cover 40 is simplified.

For example, for production of the second cover 40, a second cover 40 having no groove part 47, 49 is first formed by casting or the like. Such casting simply requires a movable mold moving in a mold opening direction while not requiring a movable mold moving in a direction perpendicular to the mold opening direction. Consequently, the overall mold is simplified. Subsequently, the produced piece is subjected to machining such as cutting to form the groove parts 47, 49. Such machining does not cause burrs that typically occur in through-hole formation, thus eliminating the need of the burring step or the like. Consequently, an increase in the number of steps is limited.

According to the above-described configuration, the convex shape of the claw part 34, 35 of the first cover 30 corresponds to the concave shape of the groove part 47, 49 of the second cover 40 as viewed from a direction perpendicular to the substrate 10. This provides sufficient contact area between the claw part 34, 35 and the groove part 47, 49, and suppresses backlash of each fitted portion; hence, wear or chipping of the claw part 34, 35 can be avoided. Consequently, sufficient attachment strength of the first cover 30 to the second cover 40 is provided while the second cover 40 has the groove parts 47, 49 in place of "through-holes".

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
a substrate on which an electronic component is mounted;

a first cover that is disposed to be opposed to a first surface of the substrate, the first cover including:
- a first sidewall part extending in a direction perpendicular to the substrate; and
- at least one claw part projecting laterally from the first sidewall part; and a second cover that is disposed to be opposed to a second surface of the substrate that is opposite to the first surface, the second cover including:
- a second sidewall part facing the first sidewall part;
- at least one groove part that is formed at the second sidewall part such that a shape of each of the at least one groove part when viewed from the direction perpendicular to the substrate is a recessed shape in conformity with a projecting shape of a corresponding one of the at least one claw part, wherein each of the at least one groove part is fitted to a corresponding one of the at least one claw part;
- at least one convex part projecting from a bottom part of an outer edge portion of the second cover in a direction perpendicular to the first and second surfaces of the substrate, the second sidewall part disposed on the at least one convex part such that the second sidewall part faces the first sidewall part; and
- each of the at least one groove part is formed at and recessed within each of the at least one convex part.

2. The electronic control unit according to claim 1, wherein:
- one of the first cover and the second cover is a resilient body; and
- the other one of the first cover and the second cover is a non-resilient body.

3. The electronic control unit according to claim 1, wherein when viewed from the direction perpendicular to the substrate, an end surface of each of the at least one claw part has a circular arc shape.

4. The electronic control unit according to claim 1, wherein the second sidewall part includes:
- a first wall surface on which the at least one groove part is formed;
- a second wall surface that is located on an opposite side of the second sidewall part from the first wall surface; and
- a swelling part that is located on the second wall surface and has a projecting shape corresponding to the recessed shape of each of the at least one groove part.

5. The electronic control unit according to claim 1, wherein:
- the at least one convex part each of which projects toward the substrate has a curved shape.

6. The electronic control unit according to claim 1, the second sidewall part comprising:
- a plurality of convex parts projecting from the outer edge portion of the second cover in intervals such that the second sidewall part of each convex part is separated and discontinuous from the second sidewall part of another convex part.

7. The electronic control unit according to claim 1, the second cover comprising a radiating part configured to thermally engage the electronic component and radiate heat generated from the electronic component.

8. The electronic control unit according to claim 7, wherein:
- the second cover is formed from a metal material.

9. The electronic control unit according to claim 7, wherein:
- the electronic component is mounted on the first surface of the substrate.

10. The electronic control unit according to claim 1, wherein:
- the first sidewall part applies a force against the second sidewall part.

11. The electronic control unit according to claim 1, wherein:
- the at least one groove part is recessed within each of the at least one convex part in a direction that is perpendicular to a direction in which the at least one convex part projects from a bottom part of an outer edge portion of the second cover.

12. An electronic control unit comprising:
- a substrate on which an electronic component is mounted;
- a first cover that is disposed to be opposed to a first surface of the substrate, the first cover including:
  - a first sidewall part extending in a direction perpendicular to the substrate; and
  - at least one claw part projecting laterally from the first sidewall part; and
- a second cover that is disposed to be opposed to a second surface of the substrate that is opposite to the first surface, the second cover including:
  - a second sidewall part facing the first sidewall part;
  - at least one groove part that is formed at the second sidewall part such that a shape of each of the at least one groove part when viewed from the direction perpendicular to the substrate is a recessed shape in conformity with a projecting shape of a corresponding one of the at least one claw part, wherein each of the at least one groove part is fitted to a corresponding one of the at least one claw part;
  - at least one convex part projecting from an outer edge portion of the second cover in a direction perpendicular to the first and second surfaces of the substrate, the second sidewall part disposed on the at least one convex part such that the second sidewall part faces the first sidewall part,
  - each of the at least one groove part is formed at a corresponding one of the at least one convex part; and
  - the second sidewall part is perpendicular to the first and second surfaces of the substrate and includes an inner wall surface that surrounds an opening of the at least one groove part.

13. An electronic control unit comprising:
- a substrate on which an electronic component is mounted;
- a first cover that is disposed to be opposed to a first surface of the substrate, the first cover including:
  - a first sidewall part extending in a direction perpendicular to the substrate; and
  - at least one claw part projecting laterally from the first sidewall part, the at least one claw part comprising an end surface that has an arcuate profile as viewed from the direction perpendicular to the substrate and a planar profile as viewed from the direction parallel to the substrate; and
- a second cover that is disposed to be opposed to a second surface of the substrate that is opposite to the first surface, the second cover including:
  - a second sidewall part facing the first sidewall part; and
  - at least one groove part that is formed at the second sidewall part such that a shape of each of the at least one groove part when viewed from the direction perpendicular to the substrate is a recessed shape in conformity with a projecting shape of a corresponding one of the at least one claw part, wherein each of the at least one groove part is fitted to a corresponding one of the at least one claw part.

\* \* \* \* \*